US012604537B2

(12) United States Patent
Jeong et al.

(10) Patent No.: US 12,604,537 B2
(45) Date of Patent: Apr. 14, 2026

(54) HIGH MOBILITY TRANSISTOR ELEMENT RESULTING FROM IGTO OXIDE SEMICONDUCTOR CRYSTALLIZATION, AND PRODUCTION METHOD FOR SAME

(71) Applicant: IUCF-HYU (INDUSTRY-UNIVERSITY COOPERATION FOUNDATION HANYANG UNIVERSITY), Seoul (KR)

(72) Inventors: Jae Kyeong Jeong, Seoul (KR); Bo Kyoung Kim, Seoul (KR); Nuri On, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 522 days.

(21) Appl. No.: 18/269,215

(22) PCT Filed: Nov. 2, 2021

(86) PCT No.: PCT/KR2021/015632
§ 371 (c)(1),
(2) Date: Jun. 22, 2023

(87) PCT Pub. No.: WO2022/139159
PCT Pub. Date: Jun. 30, 2022

(65) Prior Publication Data
US 2024/0088270 A1     Mar. 14, 2024

(30) Foreign Application Priority Data
Dec. 23, 2020     (KR) ........................ 20-2020-0181828

(51) Int. Cl.
*H10D 99/00*          (2025.01)
*H01L 21/02*          (2006.01)
(Continued)

(52) U.S. Cl.
CPC ....... *H10D 99/00* (2025.01); *H01L 21/02565* (2013.01); *H01L 21/02592* (2013.01);
(Continued)

(58) Field of Classification Search
CPC ........... H10D 30/6755; H10D 30/6756; H10D 62/80; H10D 62/875; H10D 99/00;
(Continued)

(56) References Cited

U.S. PATENT DOCUMENTS

2015/0108481 A1* 4/2015 Khang ............... H10D 30/6733
                                                            438/34
2015/0171221 A1* 6/2015 Miki ................... H10D 84/038
                                                            257/43
(Continued)

FOREIGN PATENT DOCUMENTS

KR     10-2012-0090783 A      8/2012
KR     10-2013-0135064 A     12/2013
(Continued)

OTHER PUBLICATIONS

Jae Seok Hur, et al., "Stretchable Polymer Gate Dielectric by Ultraviolet-Assisted Hafnium Oxide Doping at Low Temperature for High-Performance Indium Gallium Tin Oxide Transistors", ACS Applied Materials & Interfaces, May 24, 2019, pp. 21675-21685, vol. 11.
(Continued)

*Primary Examiner* — Julio J Maldonado
*Assistant Examiner* — Paul A Berry
(74) *Attorney, Agent, or Firm* — Sughrue Mion, PLLC

(57) ABSTRACT
Various embodiments pertain to a high mobility transistor element resulting from IGTO oxide semiconductor crystal-
(Continued)

lization, and a production method for same, the transistor element comprising a substrate and a crystalline IGTO channel layer disposed on the substrate, and being produced by converting a non-crystalline IGTO channel layer provided on the substrate to a crystalline IGTO channel layer.

15 Claims, 12 Drawing Sheets

(51) Int. Cl.

| | | |
|---|---|---|
| *H01L 23/31* | (2006.01) | |
| *H10D 30/67* | (2025.01) | |
| *H10D 62/80* | (2025.01) | |

(52) U.S. Cl.
CPC .. *H01L 21/02631* (2013.01); *H01L 21/02667* (2013.01); *H01L 23/3171* (2013.01); *H10D 30/6755* (2025.01); *H10D 62/80* (2025.01)

(58) Field of Classification Search
CPC ................. H10D 30/67; H10D 30/031; H01L 21/02565; H01L 21/02592; H01L 21/02631; H01L 21/02667; H01L 21/02381; H01L 21/02488; H01L 21/02491; H01L 21/02502; H01L 23/3171; H01L 23/291; H10K 71/40; H10K 71/421
See application file for complete search history.

(56) References Cited

U.S. PATENT DOCUMENTS

| | | | |
|---|---|---|---|
| 2016/0163865 A1* | 6/2016 | Nakayama ........... | H10D 86/423 |
| | | | 257/43 |
| 2019/0378933 A1* | 12/2019 | Inoue ................ | H01L 21/02565 |

FOREIGN PATENT DOCUMENTS

| | | |
|---|---|---|
| KR | 10-2015-0038310 A | 4/2015 |
| KR | 10-2016-0033145 A | 3/2016 |
| KR | 10-2019-0117528 A | 10/2019 |

OTHER PUBLICATIONS

International Search Report for PCT/KR2021/015632 dated Feb. 9, 2022.
Written Opinion for PCT/KR2021/015632 dated Feb. 9, 2022.

* cited by examiner 120          110

130

120          110

HIGH MOBILITY TRANSISTOR ELEMENT RESULTING FROM IGTO OXIDE SEMICONDUCTOR CRYSTALLIZATION, AND PRODUCTION METHOD FOR SAME

CROSS REFERENCE TO RELATED APPLICATIONS

This application is a National Stage of International Application No. PCT/KR2021/015632 filed Nov. 2, 2021, claiming priority based on Korean Patent Application No. 10-2020-0181828 filed Dec. 23, 2020.

TECHNICAL FIELD

Various example embodiments relate to a high mobility transistor element through an indium gallium tin oxide (IGTO) oxide semiconductor crystallization and a manufacturing method thereof.

RELATED ART

As a silicon film used as a semiconductor film of a transistor, an amorphous silicon film or a polycrystalline silicon film is used depending on the purpose. For example, in the case of a transistor included in a large-sized display device, it may be preferable to use an amorphous silicon film in which characteristics may be relatively uniformly formed even though formed over a large area. On the other hand, in the case of an element that includes a driving circuitry and the like, it may be preferable to use a polycrystalline silicon film that may exhibit high field-effect mobility. As a method of forming the polycrystalline silicon film, a method of processing an amorphous silicon film through high-temperature heat treatment or through a laser beam is known. Currently, research on using an oxide semiconductor as a channel layer of a transistor is being conducted. However, it is known that an oxide semiconductor layer is mostly an amorphous layer and is electrically and chemically unstable.

DETAILED DESCRIPTION

Technical Subject

Various example embodiments provide a high mobility transistor element through an indium gallium tin oxide (IGTO) oxide semiconductor crystallization and a manufacturing method thereof.

Solution

A transistor element according to various example embodiments may include a substrate and a crystalline indium gallium tin oxide (IGTO) channel layer provided on the substrate. The crystalline IGTO channel layer may be converted from an amorphous IGTO channel layer that is provided on the substrate through heat treatment.

A manufacturing method of a transistor element according to various example embodiments may include providing an amorphous IGTO channel layer on a substrate and converting the amorphous IGTO channel layer to a crystalline IGTO channel layer through heat treatment.

Effect of Invention

According to various example embodiments, since a transistor element is implemented to include a crystalline indium gallium tin oxide (IGTO) channel layer, a high mobility characteristic may be acquired. Here, due to overlapping of 5s orbitals, the transistor element may acquire the high mobility characteristic through cation ($In^{3+}$, $Sn^{4+}$) combination of indium (In) and tin (Sn) having small effective mass. Through this, reliability of the transistor element may be improved.

BEST MODE

Hereinafter, various example embodiments will be described with reference to accompanying drawings.

In various example embodiments, an in-rich amorphous indium gallium tin oxide (IGTO) film having high content of indium (In) may be used instead of a commonly used amorphous IGZO film. Here, as zinc (Zn) with an oxygen coordination number of 4 is excluded and tin (Sn) with an oxygen coordination number of 6 is included, the amorphous IGTO film may be crystallized at a relatively low temperature of 400° C. and may be converted to a crystalline IGTO film. Therefore, a transistor element, such as a thin film transistor (TFT), may be implemented to include a channel layer that includes the crystalline IGTO film. Here, due to overlapping of 5s orbitals, the transistor element may acquire high mobility characteristic through cation ($In^{3+}$, $Sn^{4+}$) combination of indium (In) and tin (Sn) having small effective mass.

Figure 1:
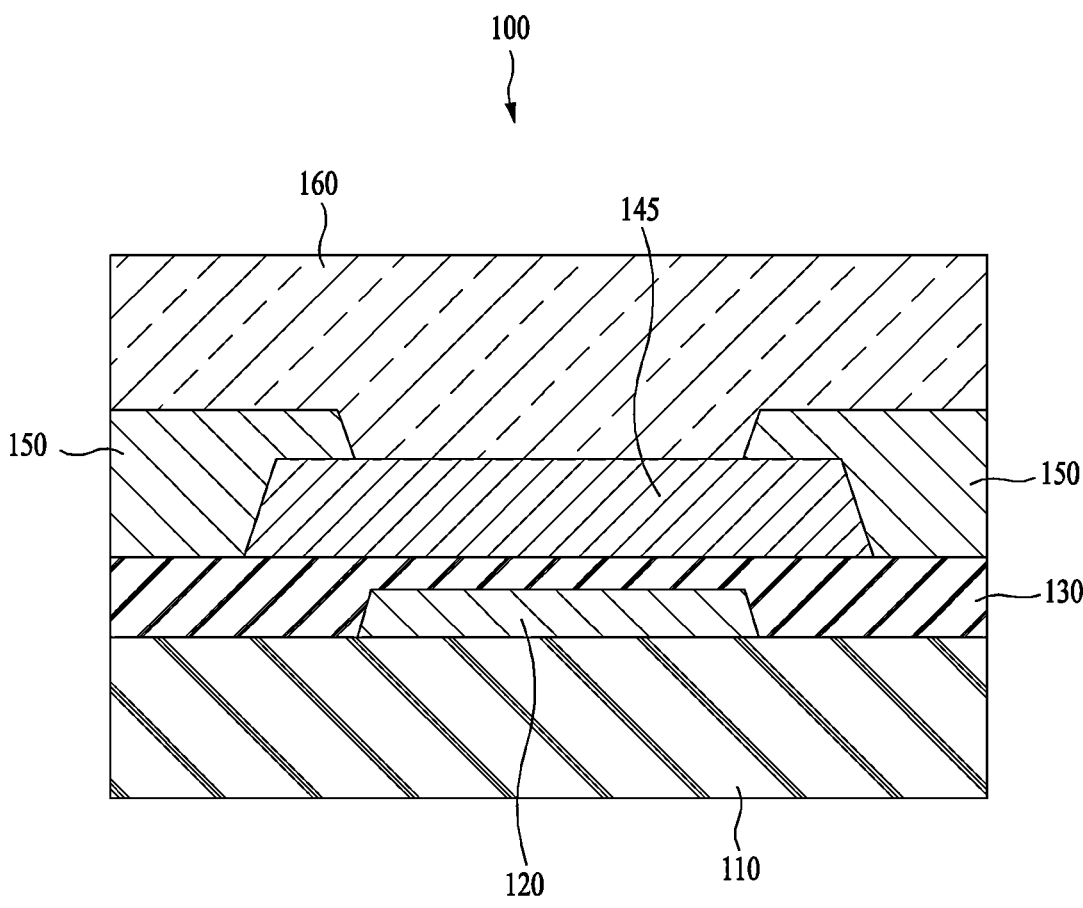
FIG. 1 illustrates a transistor element according to various example embodiments.

FIG. 1 illustrates a transistor element 100 according to various example embodiments. Referring to FIG. 1, the transistor element 100 according to various example embodiments may include a substrate 110, a first electrode 120, an insulating layer 130, a crystalline IGTO channel layer 145, at least one second electrode 150, and a protective layer 160. For example, a width of the transistor element 100 may be about 1000 μm and a length of the transistor element 100 may be about 300 μm.

The substrate 110 may support the first electrode 120, the insulating layer 130, the crystalline IGTO channel layer 145, the second electrode 150, and the protective layer 160. For example, the substrate 110 may include silicon (Si). According to an example embodiment the substrate 110 may include an insulating barrier layer (not shown). The insulating barrier layer may be exposed with respect to the first electrode 120, the insulating layer 130, the crystalline IGTO channel layer 145, the second electrode 150, and the protective layer 160, and may substantially contact at least one of the first electrode 120, the insulating layer 130, or the crystalline IGTO channel layer 145. For example, the insulating barrier layer may include silicon oxide ($SiO_2$). For example, a thickness of the substrate 110 may be about 100 nm.

The first electrode 120 may be provided on the substrate 110. According to an example embodiment, the first electrode 120 may be attached to the insulating barrier layer of the substrate 110. For example, the first electrode 120 may include at least one of aluminum (Al), chromium (Cr), copper (Cu), tantalum (Ta), titanium (Ti), molybdenum (Mo), or tungsten (W). For example, the first electrode 120 may be made of indium tin oxide (ITO). According to an example embodiment, the first electrode 120 may be a gate electrode (G).

The insulating layer 130 may be provided on the first electrode 120. Here, the insulating layer 130 may cover the first electrode 120 on the substrate 110. Through this, the insulating layer 130 may isolate the first electrode 120 and the IGTO channel layer 145 from each other.

The crystalline IGTO channel layer 145 may be provided on the insulating layer 130. Here, the crystalline IGTO channel layer 145 may include indium (In), gallium (Ga), tin (Sn), and oxygen (O). For example, cation composition ratios of indium (In), gallium (Ga), and tin (Sn) in the crystalline IGTO channel layer 145 may be 78%, 18%, and 4%.

Here, the crystalline IGTO channel layer 145 may be converted from an amorphous IGTO channel layer. In other words, the amorphous IGTO channel layer may be converted from the crystalline IGTO channel layer 145 through heat treatment. For example, the crystalline IGTO channel layer 145 may be converted from the amorphous IGTO channel layer through heat treatment at a heat treatment temperature of about 400° C. Here, the crystalline IGTO channel layer 145 may be converted from the amorphous IGTO channel layer through heat treatment for about 1 hour in the air. For example, a thickness of the amorphous IGTO channel layer may be about 20 nm. Here, the amorphous IGTO channel layer may be provided as a single layer and accordingly, the crystalline IGTO channel layer 145 may be provided as a single layer. According to an example embodiment, the amorphous IGTO channel layer may be vacuum-deposited on at least one of the substrate 110, the first electrode 120, or the insulating layer 130 using a sputtering method and then converted to the crystalline IGTO channel layer 145 through heat treatment.

The second electrode 150 may be provided on the crystalline IGTO channel layer 145. According to an example embodiment, the second electrode 150 may be provided over the insulating layer 130 and the crystalline IGTO channel layer 145. According to an example embodiment, the plurality of second electrodes 150 may be separated from each other and may be individually provided on the crystalline IGTO channel layer 145. For example, the second electrode 150 may include at least one of aluminum (Al), chromium (Cr), copper (Cu), tantalum (Ta), titanium (Ti), molybdenum (Mo), or tungsten (W). For example, the second electrode 150 may be made of indium tin oxide (ITO). According to an example embodiment, one of the second electrodes 150 may be a source electrode (source, S) and another one of the second electrodes 150 may be a drain electrode (drain, D). For example, a thickness of the second electrode 150 may be about 180 nm.

The protective layer 160 may cover the first electrode 120, the insulating layer 130, the crystalline IGTO channel layer 145, and the second electrode 150 on the substrate 110. Through this, the protective layer 160 may protect the first electrode 120, the insulating layer 130, the crystalline IGTO channel layer 145, and the second electrode 150. According to an example embodiment, the protective layer 160 may be formed using a plasma enhanced atomic layer deposition (PEALD) method. For example, the protective layer 160 may include aluminum oxide ($Al_2O_3$). For example, a thickness of the protective layer 160 may be about 10 nm.

According to an example embodiment, at least one hole (not shown) may be provided in the protective layer 160. The hole may penetrate the protective layer 160 and may lead to the surface of the second electrode 150. Through this, the hole may expose a portion of the second electrode 150.

Figure 2:
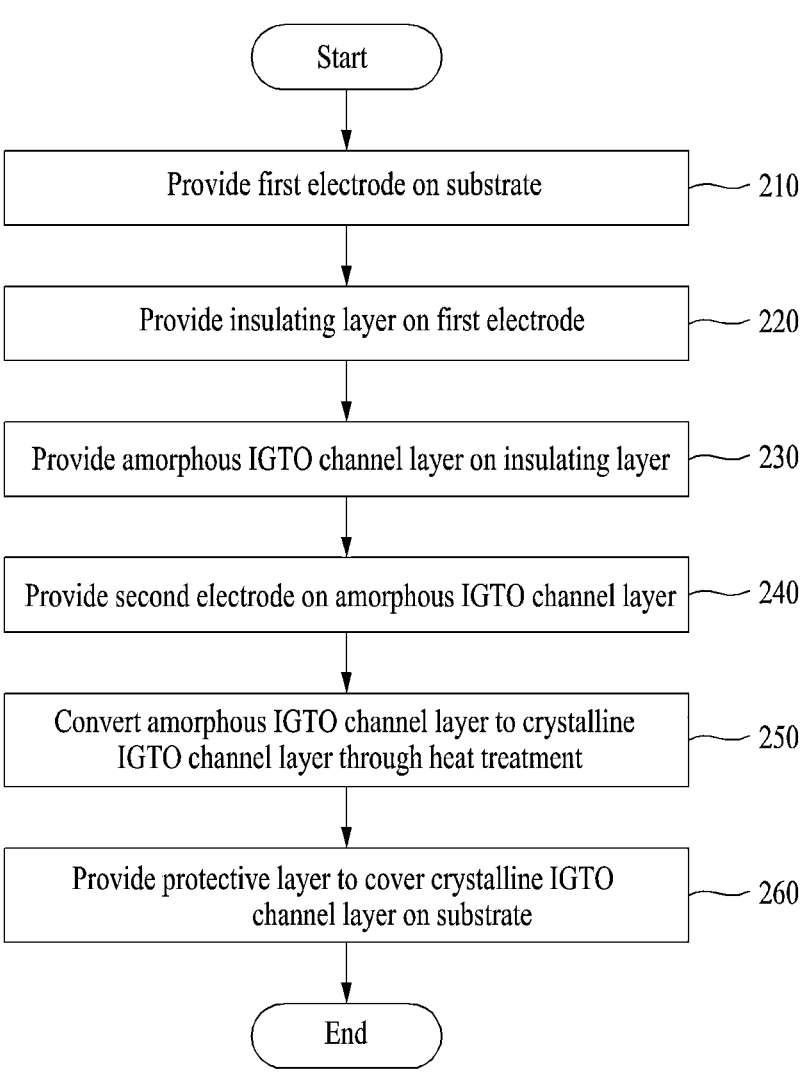
FIG. 2 illustrates a manufacturing method of a transistor element according to various example embodiments.

FIG. 2 illustrates a manufacturing method of the transistor element 100 according to various example embodiments. FIGS. 3, 4, 5, 6, 7, and 8 are views for explaining a manufacturing method of the transistor element 100 according to various example embodiments.

Figure 3:
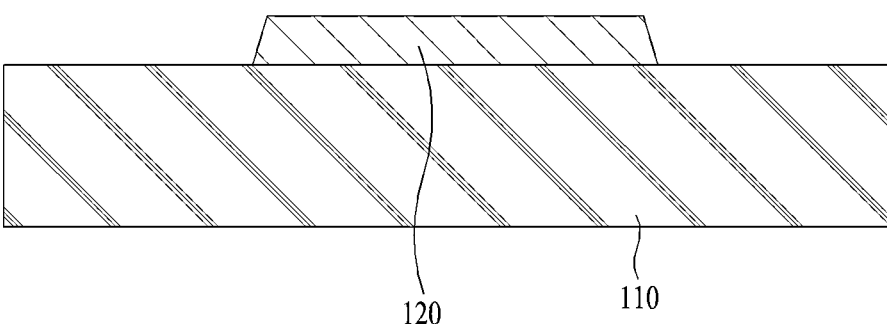
FIGS. 3, 4, 5, 6, 7, and 8 are views for explaining a manufacturing method of a transistor element according to various example embodiments.

Referring to FIG. 2, in operation 210, as illustrated in FIG. 3, the first electrode 120 may be provided on the substrate 110. For example, the substrate 110 may include silicon (Si). According to an example embodiment, the substrate 110 may include an insulating barrier layer. On the substrate 110, the insulating barrier layer may be exposed to the outside. For example, the insulating barrier layer may include silicon oxide ($SiO_2$). For example, a thickness of the substrate 110 may be about 100 nm. The first electrode 120 may be attached to the insulating barrier layer of the substrate 110. For example, the first electrode 120 may include at least one of aluminum (Al), chromium (Cr), copper (Cu), tantalum (Ta), titanium (Ti), molybdenum (Mo), or tungsten (W). For example, the first electrode 120 may be made of ITO. According to an example embodiment, the first electrode 120 may be a gate electrode (G).

Figure 4:
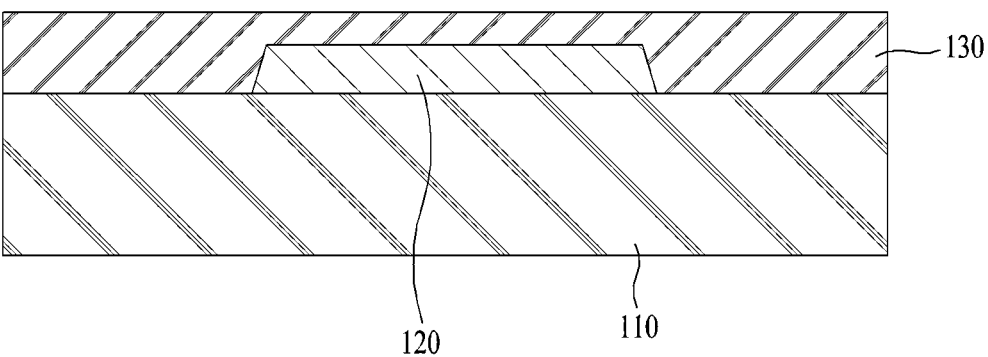

In operation 220, as illustrated in FIG. 4, the insulating layer 130 may be provided on the first electrode 120. Here, the insulating layer 130 may cover the first electrode 120 on the substrate 110.

Figure 5:
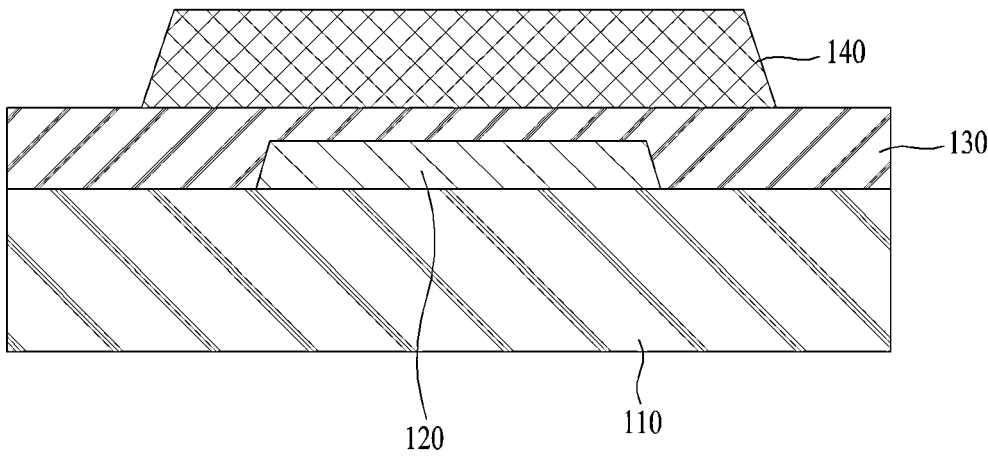

In operation 230, as illustrated in FIG. 5, the amorphous IGTO channel layer 140 may be provided on the insulating layer 130. Here, the amorphous IGTO channel layer 140 may include indium (In), gallium (Ga), tin (Sn), and oxygen (O). Here, the amorphous IGTO channel layer 140 may be provided as a single layer. According to an example embodiment, the amorphous IGTO channel layer may be vacuum-deposited on at least one of the substrate 110, the first electrode 120, or the insulating layer 130 using a sputtering method. For example, a thickness of the amorphous IGTO channel layer 140 may be about 20 nm.

Figure 6:
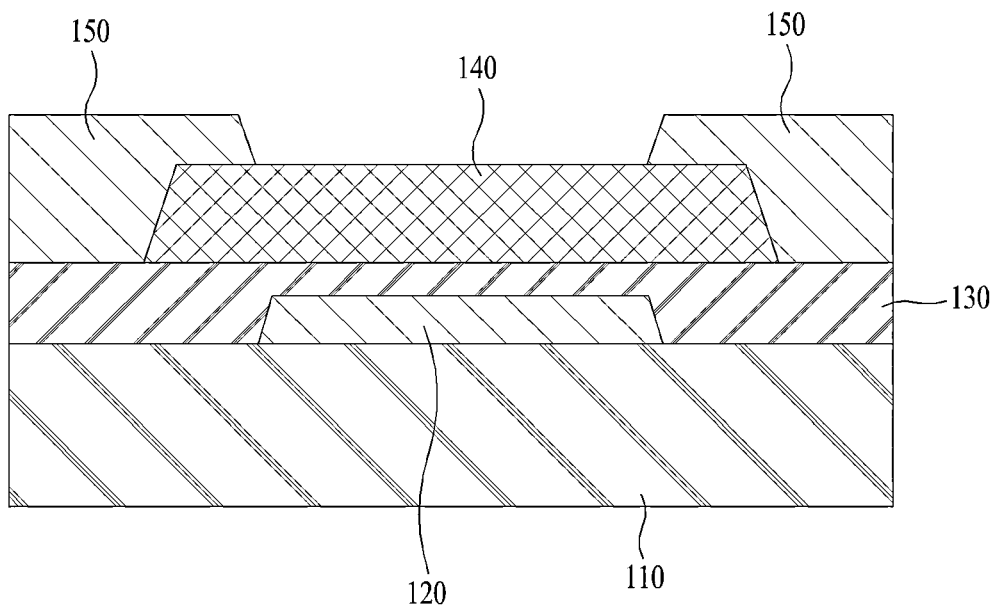

In operation 240, as illustrated in FIG. 6, the at least one second electrode 150 may be provided on the amorphous IGTO channel layer 140. According to an example embodiment, the second electrode 150 may be provided over the insulating layer 130 and the amorphous IGTO channel layer 140. According to an example embodiment, the plurality of second electrodes 150 may be separated from each other and may be individually provided on the amorphous IGTO channel layer 140. For example, the second electrode 150 may include at least one of aluminum (Al), chromium (Cr), copper (Cu), tantalum (Ta), titanium (Ti), molybdenum (Mo), or tungsten (W). For example, the second electrode 150 may be made of indium tin oxide (ITO). According to an example embodiment, one of the second electrodes 150 may be a source electrode (S) and another one of the second electrodes 150 may be a drain electrode (D). For example, a thickness of the second electrode 150 may be about 180 nm.

Figure 7:
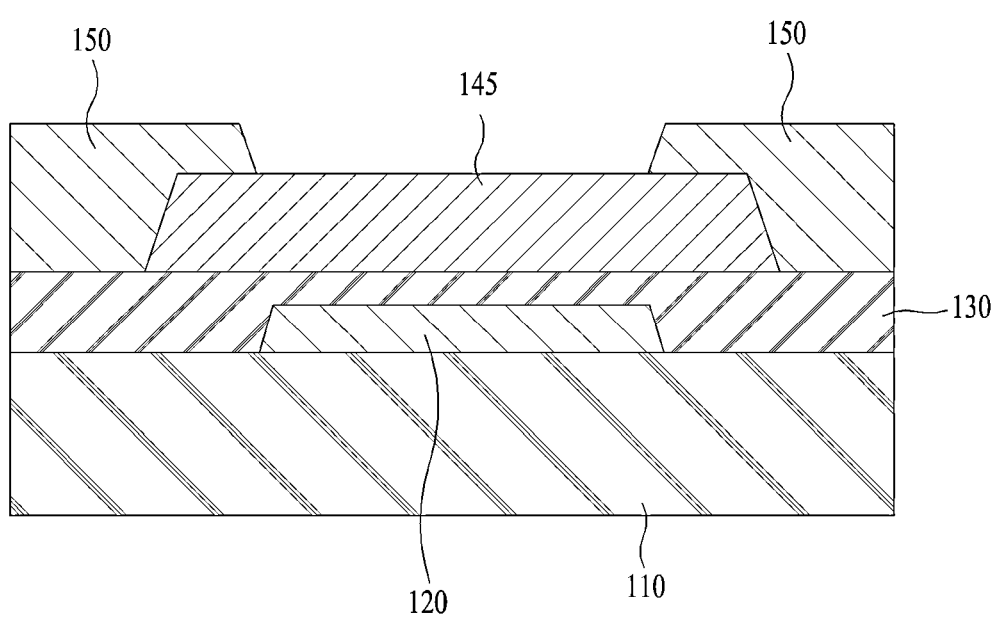

In operation 250, as illustrated in FIG. 7, the crystalline IGTO channel layer 145 may be generated from the amorphous IGTO channel layer 140 through heat treatment. That is, through the heat treatment, the amorphous IGTO channel layer 140 may be converted to the crystalline IGTO channel layer 145. For example, the crystalline IGTO channel layer 145 may be converted from the amorphous IGTO channel layer 140 through heat treatment at a heat treatment temperature of about 400° C. Here, the crystalline IGTO channel layer 145 may be converted from the amorphous IGTO channel layer 140 through heat treatment for about 1 hour in the air. Here, since the amorphous IGTO channel layer 140 is provided as a single layer, the crystalline IGTO channel layer 145 may be configured as a single layer. For example, cation composition ratios of indium (In), gallium (Ga), and tin (Sn) in the crystalline IGTO channel layer 145 may be 78%, 18%, and 4%.

Figure 8:
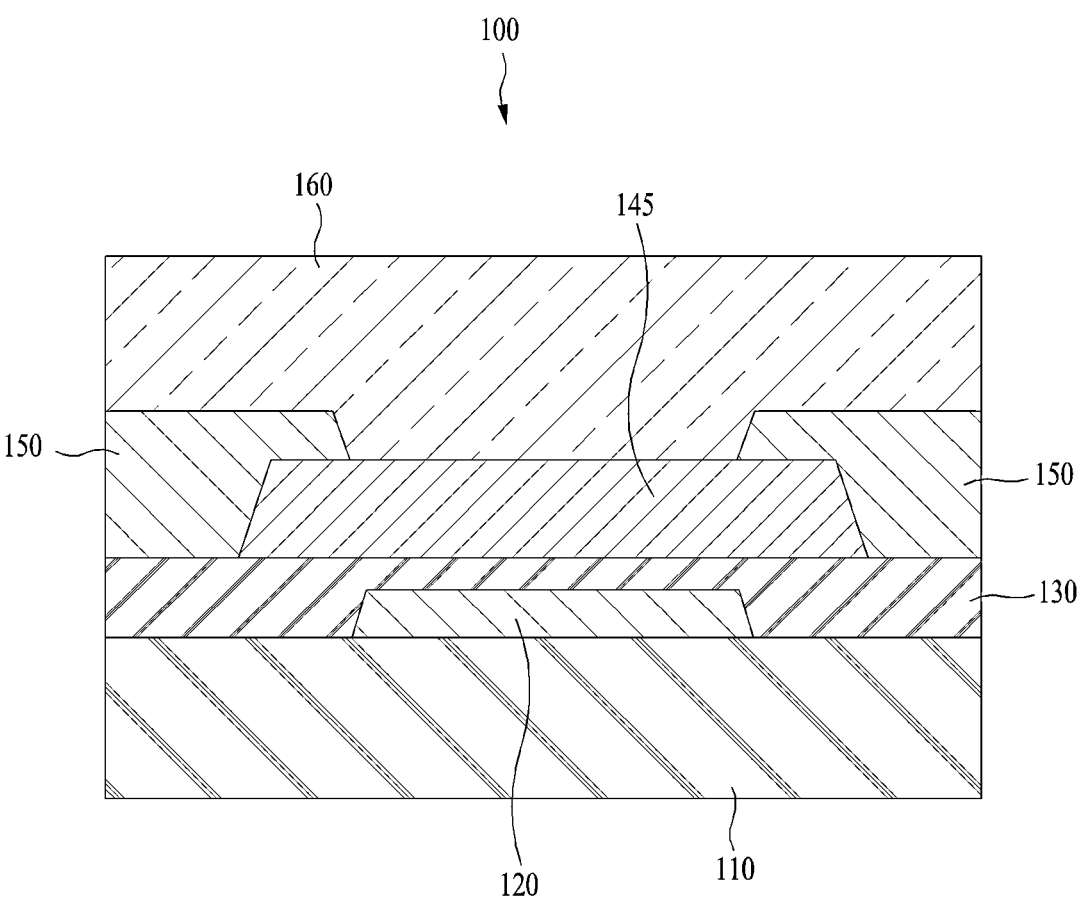

In operation 260, as illustrated in FIG. 8, the protective layer 160 may be provided to cover the crystalline IGTO channel layer 145 on the substrate 110. In detail, the protective layer 160 may cover the first electrode 120, the insulating layer 130, the crystalline IGTO channel layer 145, and the second electrode 150 on the substrate 110. Through this, the protective layer 160 may protect the first electrode 120, the insulating layer 130, the crystalline IGTO channel layer 145, and the second electrode 150. According to an example embodiment, the protective layer 160 may be formed using a PEALD method. For example, the protective layer 160 may include aluminum oxide ($Al_2O_3$). For example, a thickness of the protective layer 160 may be about 10 nm. According to an example embodiment, at least one hole (not shown) may be provided in the protective layer 160. The hole may penetrate the protective layer 160 and may lead to the surface of the second electrode 150. Through this, the hole may expose a portion of the second electrode 150.

Accordingly, the transistor element 100 having the crystalline IGTO channel layer 145 may be manufactured. Additionally, the transistor element 100 may be completed after an annealing process. For example, the annealing process may be performed on the transistor element 100 at an annealing temperature of about 100° C. Here, the annealing process may be performed on the transistor element 100 for about 1 hour in the air.

Figure 9:
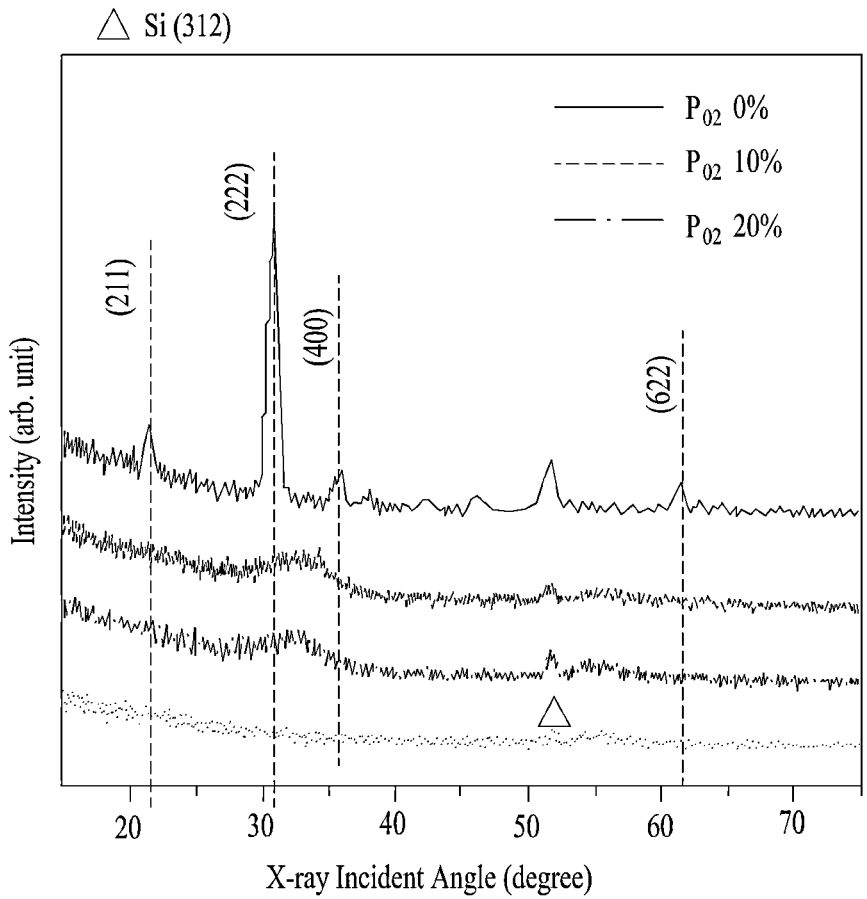
FIGS. 9, 10, 11A, 11B, 12A, and 12B are views for explaining characteristics of a transistor element according to various example embodiments.
Figure 10:
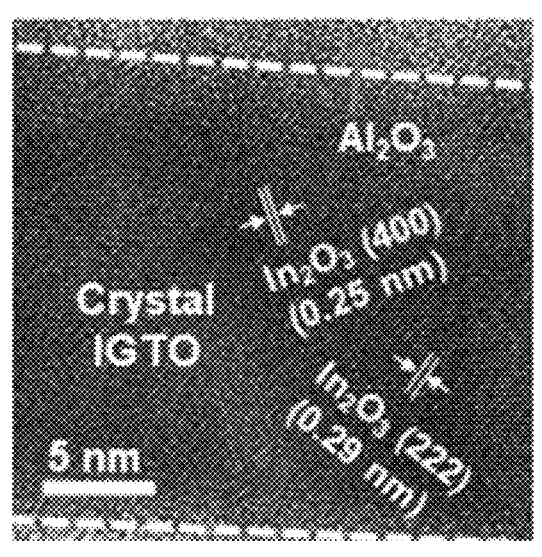
Figure 10:
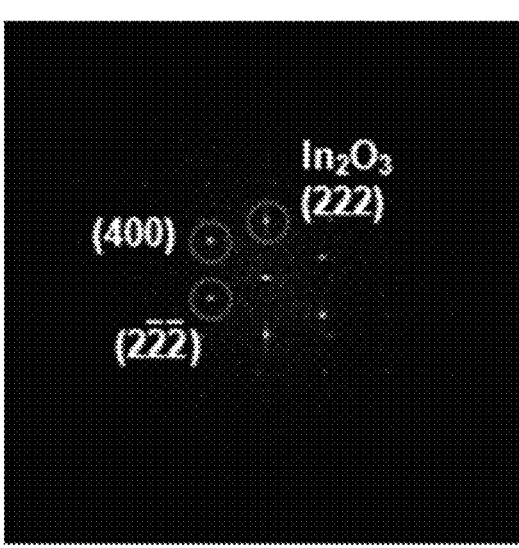

FIG. 9 illustrates glancing-incidence X-ray diffraction patterns for an IGTO film. FIG. 10 illustrates cross-sectional high-resolution transmission electron microscopy (TEM) image of an IGTO film.

Referring to FIG. 9, when an oxygen flow ratio was 10% and 20%, patterns of the IGTO film heat-treated at 400° C. did not show a peak, which represents that the IGTO film was not in a completely crystalline state. On the contrary, when the oxygen flow ratio was 0%, patterns of the IGTO film heat-treated at 400° C. showed a plurality of peaks, which represents that the IGTO film is in a completely crystalline state. Here, as illustrated in FIG. 10, the IGTO film heat-treated at the oxygen flow ratio of 0% was in a completely crystalline state.

That is, through heat treatment at the heat treatment temperature of 400° C., a state of the IGTO film changes from an amorphous state to a crystalline state. This represents that the amorphous IGTO channel layer 140 is converted to the crystalline IGTO channel layer 145 through the heat treatment at the heat treatment temperature of 400° C.

Figure 11A:
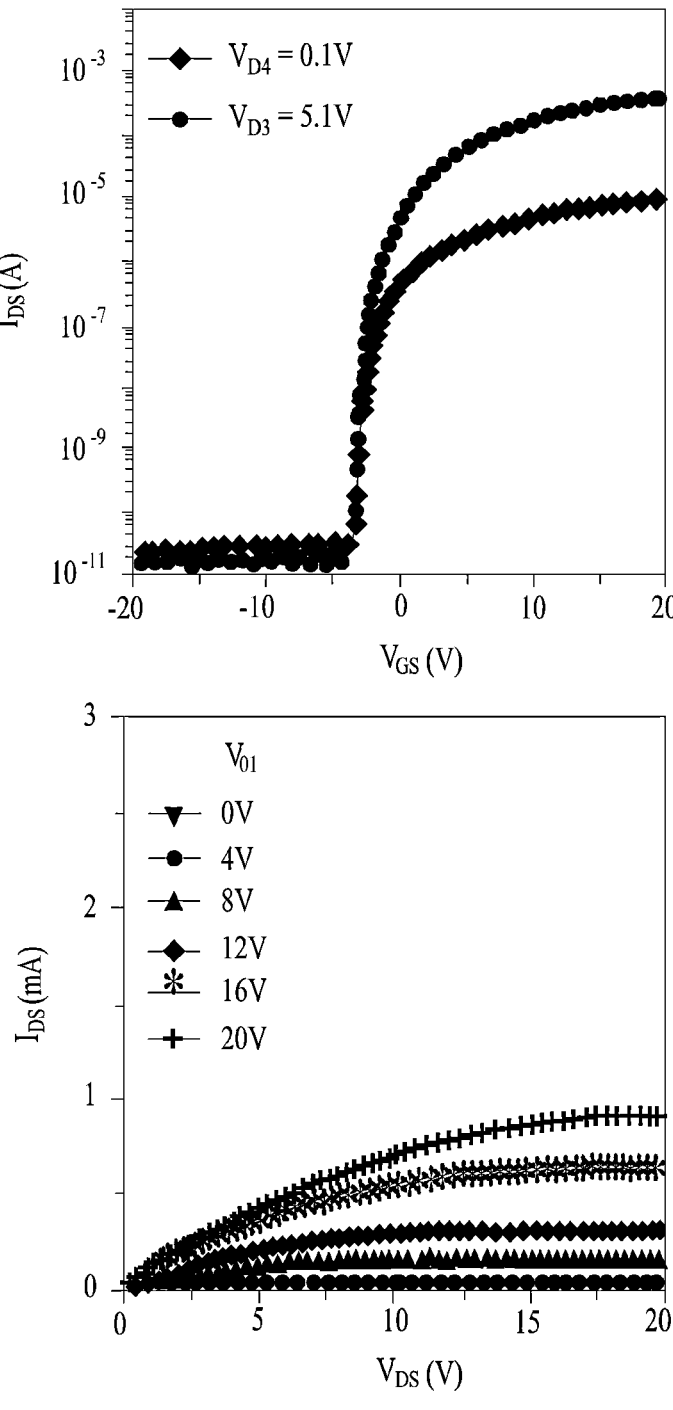
Figure 11B:
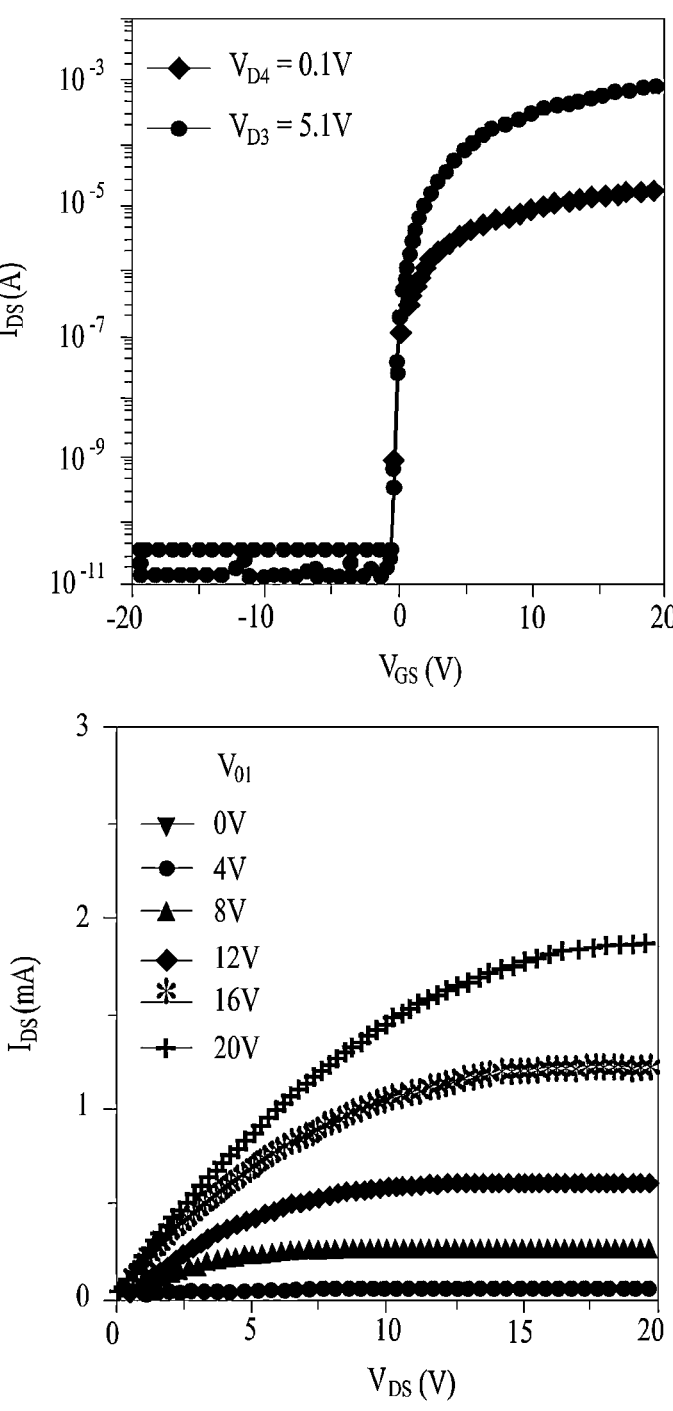
Figure 12A:
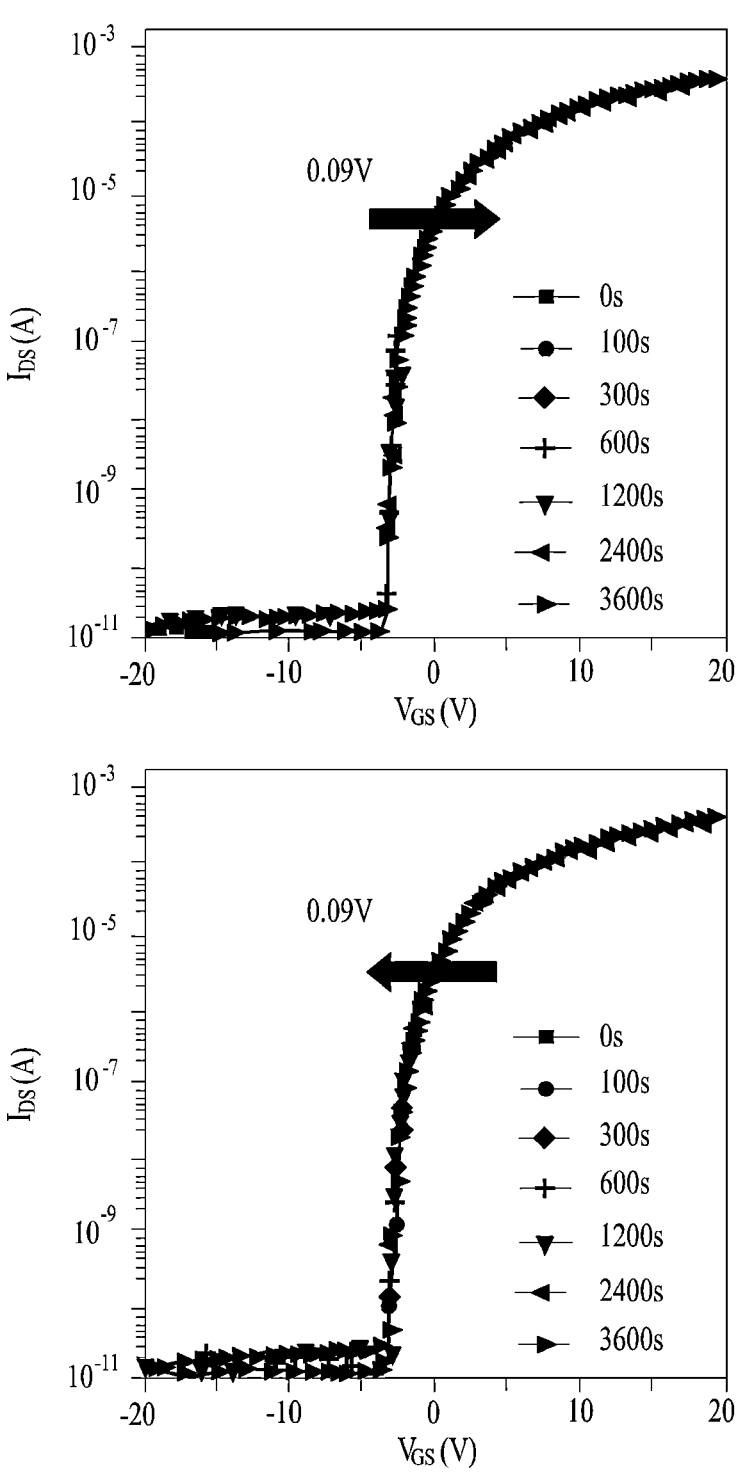
Figure 12B:
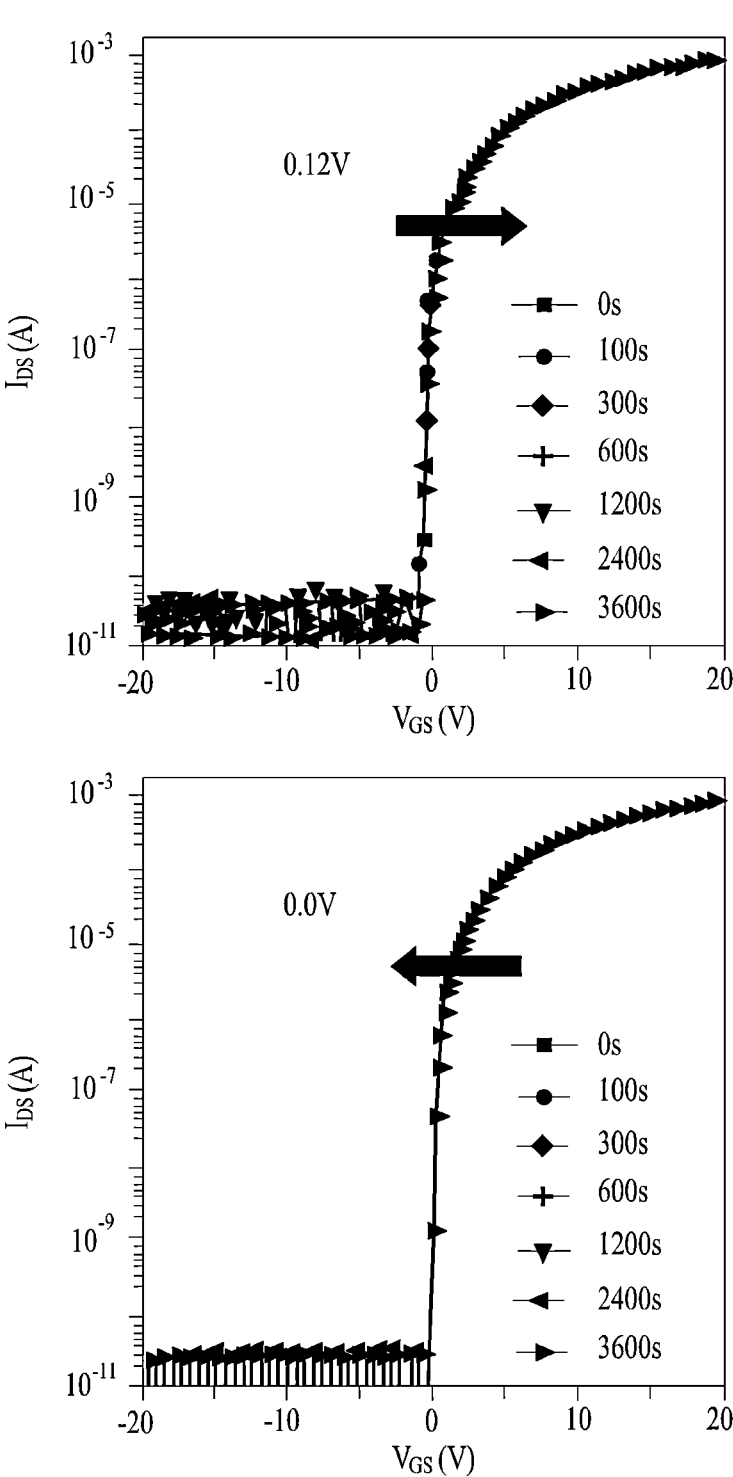

FIGS. 11A and 11B illustrate a transfer characteristic of a thin film transistor having an IGTO film. FIGS. 12A and 12B illustrate gate bias stress instability of a thin film transistor having an IGTO film. Here, FIGS. 11A and 12A illustrate a case in which the IGTO film is in an amorphous state and FIGS. 11B and 12B illustrate a case in which the IGTO film is in a crystalline state.

Referring to FIGS. 11A and 11B, the transfer characteristic of the thin film transistor when the IGTO film is in the crystalline state is significantly excellent compared to the transfer characteristic of the thin film transistor when the IGTO film is in the amorphous state. Here, the transfer characteristic of the thin film transistor when the IGTO film is in the crystalline state is excellent by about twice compared to the transfer characteristic of the thin film transistor when the IGTO film is in the amorphous state. Here, mobility of the thin film transistor is verified based on the transfer characteristic of the thin film transistor. That is, the mobility of the thin film transistor when the IGTO film is in the crystalline state is about twice compared to the mobility of the thin film transistor when the IGTO film is in the amorphous state. Through this, as illustrated in FIGS. 12A and 12B, the IGTO film is more stable when it is in the crystalline state than when it is in the amorphous state.

According to various example embodiments, since the transistor element 100 is implemented to include the crystalline IGTO channel layer 145, a high mobility characteristic may be acquired. Due to overlapping of 5s orbitals, the transistor element 100 may acquire the high mobility characteristic through cation ($In^{3+}$, $Sn^{4+}$) combination of indium (In) and tin (Sn) having small effective mass. Through this, the reliability of the transistor element 100 may be improved.

The transistor element 100 according to various example embodiments may include the substrate 110 and the crystalline IGTO channel layer 145 provided on the substrate 110.

According to various example embodiments, the crystalline IGTO channel layer 145 may be converted from the amorphous IGTO channel layer 140 that is provided on the substrate 110 through heat treatment.

According to various example embodiments, the amorphous IGTO channel layer 140 may be deposited on the substrate 110 using a sputtering method.

According to various example embodiments, the crystalline IGTO channel layer 145 may be converted from the amorphous IGTO channel layer 140 through heat treatment at a heat treatment temperature of 400° C.

According to various example embodiments, a thickness of the amorphous IGTO channel layer 140 may be 20 nm.

According to various example embodiments, cation composition ratios of indium (In), gallium (Ga), and tin (Sn) in the crystalline IGTO channel layer 145 may be 78%, 18%, and 4%.

According to various example embodiments, the transistor element 100 may further include at least one of the first electrode 120 provided between the substrate 110 and the crystalline IGTO channel layer 145 on the substrate 110, the insulating layer 130 provided between the first electrode 120 and the crystalline IGTO channel layer 145, at least one second electrode 150 provided on the crystalline IGTO channel layer 145, or the protective layer 160 formed to cover at least one of the first electrode 120, the insulating layer 130, or the second electrode 150 on the substrate 110.

A manufacturing method of the transistor element 100 according to various example embodiments may include providing the amorphous IGTO channel layer 140 on the substrate 110 and converting the amorphous IGTO channel layer 140 to the crystalline IGTO channel layer 145 through heat treatment.

According to various example embodiments, the providing of the amorphous IGTO channel layer 140 may include depositing the amorphous IGTO channel layer 140 on the substrate 110 using a sputtering method.

According to various example embodiments, the converting to the crystalline IGTO channel layer 145 may include performing the heat treatment at a heat treatment temperature of 400° C.

According to various example embodiments, a thickness of the amorphous IGTO channel layer 140 may be 20 nm.

According to various example embodiments, cation composition ratios of indium (In), gallium (Ga), and tin (Sn) in the crystalline IGTO channel layer may be 78%, 18%, and 4%.

According to various example embodiments, the providing of the amorphous IGTO channel layer 140 may include providing the first electrode 120 on the substrate 110, providing the amorphous IGTO channel layer 140 to cover the first electrode 120 on the substrate 110, and providing at least one second electrode 150 on the amorphous IGTO channel layer 140.

According to various example embodiments, the manufacturing method of the transistor element 100 may further include providing the protective layer 160 to cover the crystalline IGTO channel layer 145 on the substrate 110.

According to various example embodiments, the providing of the amorphous IGTO channel layer 140 may further include providing the insulating layer 130 on the first electrode 120 before providing the amorphous IGTO channel layer 140.

According to various example embodiments, the amorphous IGTO channel layer 140 may be a single layer.

Various example embodiments and the terms used herein are not construed to limit description disclosed herein to a specific implementation and should be understood to include various modifications, equivalents, and/or substitutions of a corresponding example embodiment. In describing the drawings, like reference numerals refer to like components throughout the present specification. The singular forms "a," "an," and "the" are intended to include the plural forms as well, unless the context clearly indicates otherwise. Herein, the expressions, "A or B," "at least one of A and/or B," "A, B, or C," "at least one of A, B, and/or C," and the like may include any possible combinations of listed items. Terms "first," "second," etc., are used to describe corresponding components regardless of order or importance and the terms are simply used to distinguish one component from another component. The components should not be limited by the terms. When a component (e.g., a first component) is described to be "connected to" or "accessed to" another component (e.g., a second component), the component may be directly connected to the other component or may be connected through still another component (e.g., a third component).

According to various example embodiments, each of the components may include a singular object or a plurality of objects. According to various example embodiments, at least one of the components or operations may be omitted. Alternatively, at least one another component or operation may be added. Alternatively or additionally, a plurality of components may be integrated into a single component. In this case, the integrated component may perform one or more functions of each of the components in the same or similar manner as it is performed by a corresponding component before integration.

What is claimed is:

1. A manufacturing method of a transistor element, the method comprising:

providing an amorphous indium gallium tin oxide (IGTO) channel layer on a substrate; and converting the amorphous IGTO channel layer to a crystalline IGTO channel layer through heat treatment.

2. The method of claim 1, wherein the providing of the amorphous IGTO channel layer comprises depositing the amorphous IGTO channel layer on the substrate using a sputtering method.

3. The method of claim 1, wherein the converting to the crystalline IGTO channel layer comprises performing the heat treatment at a heat treatment temperature of 400° C.

4. The method of claim 1, wherein a thickness of the amorphous IGTO channel layer is 20 nm.

5. The method of claim 1, wherein cation composition ratios of indium (In), gallium (Ga), and tin (Sn) in the crystalline IGTO channel layer are 78%, 18%, and 4%.

6. The method of claim 1, wherein the providing of the amorphous IGTO channel layer comprises:

providing a first electrode on the substrate;

providing the amorphous IGTO channel layer to cover the first electrode on the substrate; and providing at least one second electrode on the amorphous IGTO channel layer.

7. The method of claim 1, further comprising:

providing a protective layer to cover the crystalline IGTO channel layer on the substrate.

8. The method of claim 6, wherein the providing of the amorphous IGTO channel layer further comprises providing an insulating layer on the first electrode before providing the amorphous IGTO channel layer.

9. The method of claim 1, wherein the amorphous IGTO channel layer is a single layer.

10. A transistor element comprising:

a substrate; and a crystalline indium gallium tin oxide (IGTO) channel layer provided on the substrate, wherein the crystalline IGTO channel layer is converted from an amorphous IGTO channel layer that is provided on the substrate through heat treatment.

11. The transistor element of claim 10, wherein the amorphous IGTO channel layer is deposited on the substrate using a sputtering method.

12. The transistor element of claim 10, wherein the crystalline IGTO channel layer is converted from the amorphous IGTO channel layer through the heat treatment at a heat treatment temperature of 400° C.

13. The transistor element of claim 10, wherein a thickness of the amorphous IGTO channel layer is 20 nm.

14. The transistor element of claim 10, wherein cation composition ratios of indium (In), gallium (Ga), and tin (Sn) in the crystalline IGTO channel layer are 78%, 18%, and 4%.

15. The transistor element of claim 10, further comprising at least one of:

a first electrode provided between the substrate and the crystalline IGTO channel layer on the substrate;

an insulating layer provided between the first electrode and the crystalline IGTO channel layer;

at least one second electrode provided on the crystalline IGTO channel layer; or a protective layer formed to cover at least one of the first electrode, the insulating layer, or the second electrode on the substrate.

* * * * *